United States Patent [19]

Norton

[11] 4,117,463
[45] Sep. 26, 1978

[54] CIRCUIT FAULT DETECTION APPARATUS FOR RAILROAD TRACK CIRCUIT REDUNDANT CONNECTIONS

[75] Inventor: David John Norton, Bathampton, England

[73] Assignee: Westinghouse Brake & Signal Co. Ltd., Chippenham, England

[21] Appl. No.: 815,474

[22] Filed: Jul. 14, 1977

[30] Foreign Application Priority Data

Jul. 28, 1976 [GB] United Kingdom ............... 31386/76

[51] Int. Cl.$^2$ ....................... G01R 31/02; G08B 21/00
[52] U.S. Cl. ........................................ 340/652; 324/51
[58] Field of Search ................... 324/51, 52; 340/255, 340/256, 253 B; 361/42, 45

[56] References Cited

U.S. PATENT DOCUMENTS

| | | | |
|---|---|---|---|
| 710,990 | 10/1902 | Myers | 340/255 |
| 1,298,710 | 4/1919 | Hess | 340/256 |
| 1,889,832 | 12/1932 | Hamm | 340/255 X |
| 2,622,139 | 12/1952 | Dodd | 340/255 |
| 2,832,916 | 4/1958 | Kennedy | 340/255 X |
| 3,387,064 | 6/1968 | Joy et al. | 340/256 X |
| 3,671,809 | 6/1972 | Ryan et al. | 340/255 X |
| 3,723,813 | 3/1973 | Allen | 340/256 X |

*Primary Examiner*—Gerard R. Strecker

*Attorney, Agent, or Firm*—A. G. Williamson, Jr.; R. W. McIntire, Jr.

[57] ABSTRACT

Continuity detector apparatus is coupled into duplicate conductors connected in parallel between each rail of a track section and an energy source or occupancy receiver of an associated track circuit to detect and register a fault in either parallel conductor and to indicate need for corrective action to restore the operational security provided by the duplicate circuit paths. In one form, each detector is a two-winding relay with one winding inserted in series in each of the duplicate circuit paths so poled that equal track current flows in opposite directions in the winding, when both conductors are unbroken to hold the relay released. Any interruption of either parallel conductor causes the relay to pick up to register the fault and transmit a corresponding indication. In a second form, a different transformer winding is connected with each conductor. An alternating current voltage of selected frequency is applied to the other winding of one transformer which, if both track conductors are complete, causes a current to flow in a loop including each conductor. This produces an output from the other winding of the other transformer which is applied through a filter and amplifier to hold energized the detector relay. A break in either conductor interrupts the loop, deenergizing the relay which releases to register the fault and activate an indication to signal a need for repairs.

11 Claims, 1 Drawing Figure

U.S. Patent    Sept. 26, 1978    4,117,463
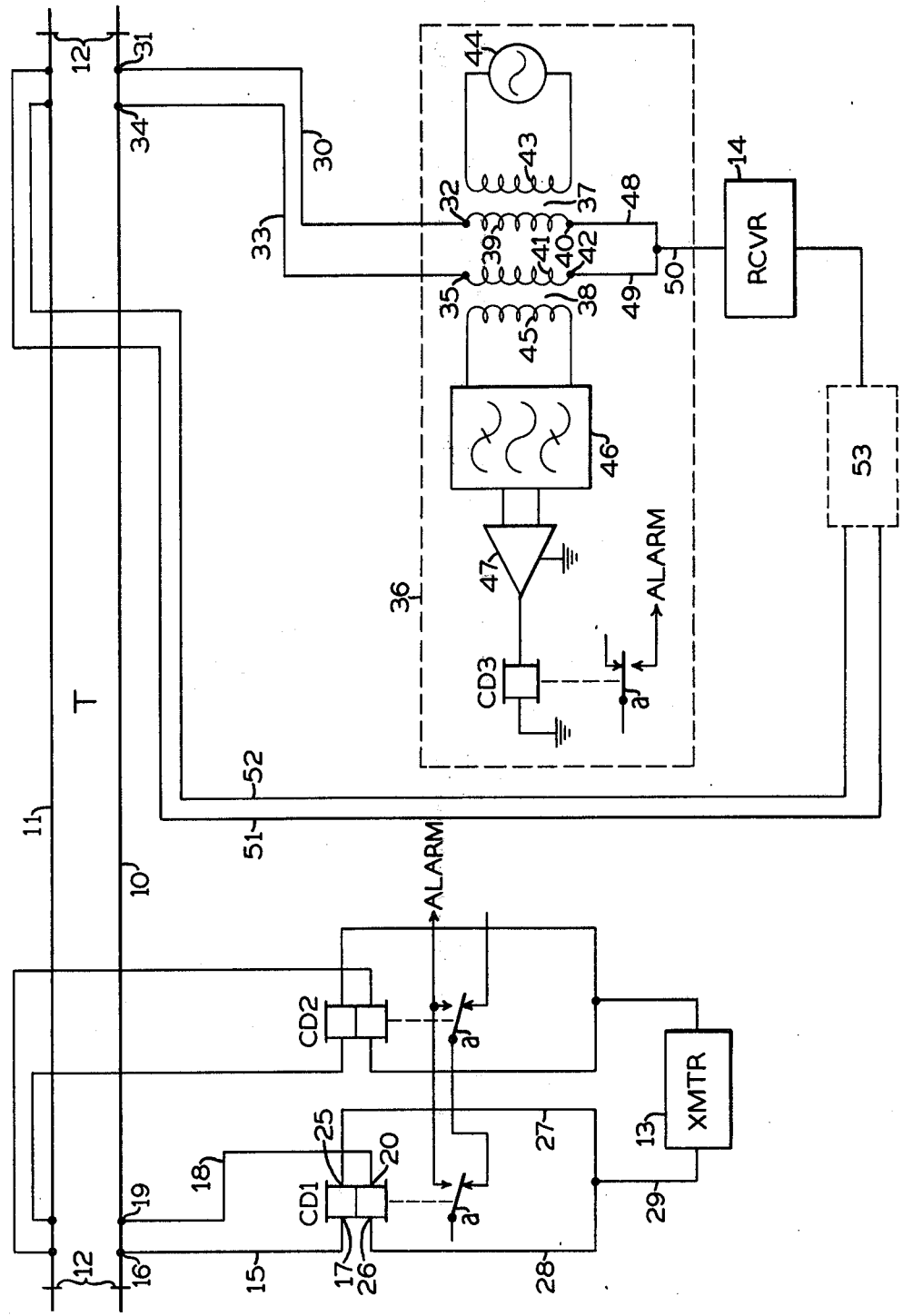

CIRCUIT FAULT DETECTION APPARATUS FOR RAILROAD TRACK CIRCUIT REDUNDANT CONNECTIONS

BACKGROUND OF THE INVENTION

My invention pertains to circuit fault detection apparatus for railroad track circuit connections. More particularly, the invention relates to apparatus to detect the opening of either of two parallel circuit leads connecting one part of a track circuit system to another part to provide assured circuit connections.

Where operational reliability of an electrical system is desired or a necessity, critical circuit connections subject to damage may be duplicated by parallel wires between connected terminals. This provides circuit continuity if one wire breaks and thus prevents shutdown or failure of the apparatus. A prime example is found in railroad signal systems and particularly at the rail connections from the wayside energy source or train detectors for track circuits. However, if one wire of the parallel pair opens, the circuit is then dependent for operation on the remaining wire. No protection or security remains against system failure if the remaining single wire connection breaks. There is no automatic indication when the one wire breaks since system operation continues. What is needed is an indication of the fault, i. e., an open circuit in one wire of the pair, so that redundant protection against failure can be restored.

Accordingly, an object of my invention is circuit fault detection apparatus for detecting and indicating an open circuit condition in either of a pair of parallel conductors connected between two terminals in an electrical system.

Another object of my invention is an arrangement of apparatus for detecting the failure of either one of duplicate connections between two circuit locations.

Still another object of the invention is circuit fault detection apparatus to check continuity of each of duplicate wire connections between two terminals and to indicate when either connection opens.

A further object of my invention is apparatus for detecting and indicating a fault in either one of two parallel connections between track circuit wayside apparatus and one rail of the corresponding track section.

Yet another object of the invention is circuit fault detection apparatus for determining the continuity of each of duplicate connectors between points on one common conductor and points on a second common conductor.

Other objects, features, and advantages of my invention will become apparent from the following description and appended claims when taken with the accompanying drawing.

SUMMAR OF THE INVENTION

In the broad scope, the invention is based on an electrical connection between first and second electrical bus conductors. This connection includes a first electrical conductor extending between and connected to a first point on the first bus and a second point. Also included is a second electrical conductor extending between and connected to a third point on the first bus and a fourth point. Finally, the connection includes a coupling and detection means which couples the second and fourth points to the second bus to establish an electrical connection between the first and second buses when at least one of the first or second conductors is unbroken. The coupling and detection means is responsive to the flow of current in the first and second conductors to detect the interruption, i. e., lack of continuity, of either conductor.

The specific example shown uses the arrangement in connection with a railroad track circuit to provide assured connections between the track and the energy source or train detector means. As illustrated, the first bus is one of the rails while the second bus is a common connection to one terminal of the source or detector. The first and second conductors are wires connected in parallel between the rail and the wayside apparatus.

In one form, the coupling and detection means is a two-winding relay. One winding is connected between the second point and the second bus while the other winding is connected between the fourth point and the second bus. The two windings are connected with opposite polarities so that the magnetic fields created by the relatively equal currents flowing in unbroken first and second conductors cancel and the relay remains released under normal conditions. If either conductor is interrupted, the relay responds to the current flowing in the remaining conductor and operates to open or close a contact to register a fault indication.

In a second form, the coupling and detection means comprises a first and second transformer, an alternating current generator, and a receiver arrangement sensitive only to the generator output frequency. The secondary winding of the first transformer is connected between the second point and the second bus and the primary winding of the second transformer is connected between the fourth point and the second bus. The generator is connected across the primary of the first transformer to induce a current in the loop formed by the first and second conductors, the first secondary and the second primary windings, and the two buses. The signal induced in the second transformer secondary winding is applied to the receiver arrangement to register an indication that both conductors are unbroken. The actual registry device is a relay which releases, when either conductor is broken to interrupt the loop, to register a fault indication. Either of these forms may be used when applying the circuit fault detector arrangement to a railroad track circuit in the manner previously mentioned.

BRIEF DESCRIPTION OF THE DRAWING

Before defining the invention in the appended claims, I shall describe in more detail the illustrated circuit arrangements, referring from time to time to the single drawing FIGURE.

The single drawing FIGURE is a schematic circuit diagram of a railroad track circuit including circuit fault detection apparatus embodying two forms of the invention.

DESCRIPTION OF THE ILLUSTRATED EMBODIMENTS

Referring to the drawing, lines 10 and 11 represent the rails of a track section T set off at each end by insulated joints 12 illustrated by conventional symbols. The transmitter block 13 at the lower left represents the source of energy for a track circuit for section T. This source may be a conventional track battery, another type of direct current (DC) source, a commercial alternating current (AC) source, or an audio (AF) or higher (HF) frequency transmitter in accordance with the type of track circuits in use in the stretch of track including section T. Block 14 at the right represents the receiver means for the track circuit which is responsive to source 13 through the rails for registering the occupancy condition of section T. Receiver 14 may be a DC or an AC track relay or an AF/HF receiver unit tuned to the frequency of transmitter 13, in accordance with the type of track circuit as fixed by the character of the source.

All this is conventional and understood by those familiar with the railroad signaling art. Each terminal of source 13 and receiver 14 is connected to a rail of section T by paralleled duplicate conductors to avoid failure of the track circuit if one conductor is interrupted or opens accidently, for example, due to wayside work or vandalism. Details of these circuit arrangements will now be described.

At the left end of section T, a first conductor or wire lead 15 is connected between a first point 16 on rail 10 and a second point 17. A second conductor 18 is connected between a third point 19, on rail 10, and a fourth point 20. Points 16 and 19 may, if necessary, be coincident but are preferably spaced a short distance apart so that rail 10 serves as a bus bar terminus for additional security. Since points 17 and 20 are normally within a wayside case, conductors 15 and 18 provide security and/or protection against total interruption of the track circuit over a major portion of the distance between source 13 and rail 10.

Connected in series with leads 15 and 18, and coupling points 17 and 20 to one terminal of source 13, is a means for detecting a break in either lead. In this first form, this means is continuity detector relay CD1, which is of the two-winding type as illustrated by a conventional symbol.

If transmitter 13 is a DC source, relay CD1 is a DC relay. If element 13 is an AC source, or an AF/HF transmitter, relay CD1 may be an AC relay but more likely a DC relay with special couplings to leads 15 and 18 (including rectifiers) to allow response to the alternating track current. Point 17 is the left terminal of the upper winding while point 20 is the right terminal of the lower winding. The other terminal 25 of the upper winding is connected by lead 27 and bus wire 29 to the left terminal of source 13. Similarly, the other terminal 26 of the lower winding is connected to the same terminal of element 13 by lead 28 and bus 29. Bus 29 may be a common connection of leads 27 and 28 at the terminal of unit 13 but for convenience is shown as a separate short lead.

The duplicate paths are adjusted so that the track circuit divides equally through each winding of relay CD1. As illustrated schematically, the circuits are arranged so that these currents flow in opposite directions in the two windings to create opposing flux. The magnetic fields in the relay yoke thus cancel and the relay remains released when the parallel paths through lead 15 and 18 are intact. If either conductor 15 or 18 opens for any reason, the corresponding winding of relay CD1 is deenergized. The entire track current then flows through the other winding and creates a magnetic field to pick up relay CD1. The resultant closing of front contact $a$ of this relay completes a circuit, conventionally shown, to actuate an alarm and/or register an indication of the fault condition to signal the need for corrective action. The circuit connections between the right terminal of source 13 and rail 11 are identical and include the windings of another continuity detector relay CD2 which responds in a similar manner to detect a fault in either parallel path and operates its contact $a$ to indicate the presence of the fault.

The circuit arrangement connecting receiver 14 to the rails illustrates the second form of the invention. It will be understood, however, that normally a track circuit system will use the same form of the invention at all locations. Only for convenience and drawing simplicity is a different form shown at each end of section T. At the right end, a first conductor 30 is connected between a first point 31 on rail 10 and a second point 32. To provide a duplicate path, a second conductor 33 is connected between a third point 34 on rail 10 and a fourth point 35. Points 31 and 34 are spaced apart so that rail 10 serves as a bus conductor. Points 32 and 35 are within a wayside case so that leads 30 and 33 provide duplicate paths over the more vulnerable stretch of the rail connection.

The apparatus within dashed block 36 provides the means to couple receiver 14 to the rails and to detect a fault in either circuit path. This apparatus includes a first and a second transformer 37 and 38. The second point 32 is one terminal of the secondary winding 39 of transformer 37, the other terminal 40 of which is connected to one terminal of receiver 14 by lead 48 and common bus 50. The fourth point 35 is one terminal of the primary winding 41 of transformer 38, the other terminal 42 of which is connected to the one terminal of receiver 14 by lead 49 and common bus 50. Rail 10 is thus connected to receiver 14 by two parallel paths; one including conductor 30, winding 39, lead 48, and bus 50; the other consisting of conductor 33, winding 41, lead 49, and bus 50. It will be appreciated that bus 50 may be simply a common connection of leads 48 and 49 to the terminal of receiver 14.

Connected across primary winding 43 of transformer 37 is an AC generator 44, whose output frequency is selected to distinguish from any other frequency appearing in section T rails, i. e., track circuit energy of propulsion current and its harmonics. Generator 44 induces a loop current through the path of winding 39, conductor 30, rail 10, conductor 33, winding 41, and leads 49 and 48. Connected across the secondary winding 45 of transformer 38, to receive energy induced in that winding by the 100$p$ current, is a band pass filter 46, shown by a block with conventional symbols. The bandpass frequency is that of generator 44 while the filter must block the track circuit frequency, the propulsion current frequency, and harmonics of the latter. The output of filter 46 is applied to a buffer amplifier and relay driver unit 47. The output of unit 47 is applied to the winding of the continuity detector relay CD3.

When conductors 30 and 33 are complete, as well as the short paths through the transformer windings to receiver 14, the output of generator 44 is coupled through the loop to actuate amplifier 47 and thus energize relay CD3. Front contact $a$ of this relay is thus normally closed. If either conductor 30 or 33 is broken, the loop is interrupted and no energy passes through filter 46 to amplifier 47. Relay CD3 is thus deenergized and releases to close its back contact $a$ to register a fault condition. This actuates an alarm and/or transmits an indication of the fault to request corrective action. The connection of rail 11 to the other terminal of receiver 14 is by conductors 51 and 52 and apparatus 53. The apparatus within the dashed block 53 is identical to that within block 36 and there is no need to describe its operation in detail.

The circuit fault detection apparatus of my invention thus provides an effective means for detecting and indicating a fault condition in either one of two conductors connected in parallel between two bus conductors. This allows the correction of the single fault before the other conductor is interrupted, to restore the duplicate connections provided to increase the reliability of the system. When used in a railroad track circuit, to provide security against interruption of track connections by wayside work, the two illustrated forms provide a preferred arrangement for DC and AC track circuits, respectively. The arrangement provides an efficient operation with a minimum amount of apparatus so that economy is achieved.

Although only two forms of fault detection apparatus embodying the invention are shown and described, it is to be understood that other changes and modifications within the scope of the appended claims may be made without departing from the spirit and scope of the invention.

Having now described the invention, what I claim as new and desire to secure by Letters Patent, is:

1. Circuit fault detection apparatus for a railroad track circuit, which provides a secure connection between one rail of the corresponding track section and a wayside apparatus terminal bus, comprising in combination,
    (a) a first electrical conductor connected between a first point on said one rail and a second point,
    (b) a second electrical conductor connected between an adjacent third point on said one rail and a fourth point, and
    (c) detection means coupled between said second and fourth points and said apparatus terminal bus for completing an electrical connection between said one rail and said apparatus terminal bus when at least one of said first and second conductors remains unbroken,
    (d) said detection means being responsive to the pattern of current flow in said first and second conductors for detecting whether both conductors are complete or one is interrupted, said detection means actuating a fault indication if an interrupted conductor is detected.

2. Circuit fault detection apparatus as defined in claim 1 in which,
    (a) said detection means is a two-winding relay operable to a first and a second position and with one winding connected between said second point and said apparatus terminal bus and the other winding connected between said fourth point and said apparatus terminal bus,
    (b) said winding connections so poled that equal currents normally flow in opposite directions in the two windings when said first and second conductors are unbroken to hold said relay in its first position,
    (c) said relay responsive to the change in current flow upon interruption of either conductor for operating to its second position to actuate an indication of the conductor fault.

3. Circuit fault detection apparatus as defined in claim 1 in which said detection means comprises,
    (a) a first and a second transformer, each with a primary and a secondary winding,
        (1) the secondary winding of said first transformer connected between said second point and said apparatus terminal bus,
        (2) the primary winding of said second transformer connected between said fourth point and said apparatus terminal bus,
    (b) an alternating current generator connected across the primary winding of said first transformer for inducing a current in a series loop comprising said first transformer secondary winding, said first conductor, said one rail between said first and third points, said second conductor, said second transformer primary winding, and said apparatus terminal bus, and
    (c) receiver means coupled to the secondary winding of said second transformer and responsive to its output resulting from a loop current for registering an indication that both said first and second conductors are unbroken,
        (1) said receiver means further responsive to the absence of loop current when either said first or second conductor is interrupted for registering an indication of the fault condition of one conductor.

4. Circuit fault detection apparatus as defined in claim 3 in which,
    (a) said generator has a selected output frequency distinct from the frequency of any other current which may flow in said loop,
and in which said receiver means comprises,
    (b) a band pass filter tuned to pass only the selected frequency of said generator, and
    (c) a register relay coupled to receive a signal passed by said filter and responsive thereto for registering an indication of the unbroken condition of said first and second conductors,
    (d) said relay responsive to the absence of any signal passed by said filter for registering an indication of a fault condition in said first or said second conductor.

5. A circuit fault detection arrangement for railroad track circuits providing increased security against circuit interruption of connections between a track rail and wayside apparatus, comprising in combination,
    (a) a first electrical conductor connected between a first point on said rail and a second point,
    (b) a second electrical conductor connected between a third point on said rail and a fourth point,
    (c) coupling and detection means connecting said second and fourth points to one terminal of said wayside apparatus for providing dual circuit paths between said rail and said apparatus,
    (d) said coupling and detection means responsive to the lack of continuity of either said first or said second conductor for registering a fault condition in one of said dual circuit paths, whereby the requirement for corrective action is indicated prior to a complete interruption of the rail to apparatus connection.

6. A circuit fault detection arrangement as defined in claim 5 in which,
    (a) said coupling and detection means is a two-winding relay having one winding connected between said second point and said one terminal of said wayside apparatus and the other winding connected between said fourth point and said one terminal,
    (b) said winding connections so poled that equal portions of the track current flow in opposite directions in the two windings when said first and second conductors are unbroken to hold said relay unoperated, (c) said relay operating in response to a change in the pattern of current flow when either said first or second conductor is interrupted for registering an indication of the conductor fault condition.

7. A circuit fault detection arrangement as defined in claim 5 in which said coupling and detection means comprises, (a) a first and a second transformer, each with a primary and a secondary winding,
   (1) the secondary winding of said first transformer connected between said second point and said one terminal of said wayside apparatus,
   (2) the primary winding of said second transformer connected between said fourth point and said one terminal, (b) an alternating current generator connected across the primary winding of said first transformer for inducing a corresponding current in a series loop circuit comprising said first transformer secondary winding, the portion of said rail between said first and third points, said second transformer primary, and said one terminal, and (c) receiver means coupled to the secondary winding of said second transformer and responsive to an output induced by a loop current for registering an indication of the unbroken condition of both said first and second conductors, (d) said receiver means further responsive to the absence of loop current when either said first or said second conductor is interrupted for registering an indication of the fault condition in one conductor.

8. A circuit fault detection arrangement as defined in claim 7 in which, (a) said generator has a selected output frequency distinct from the frequency of any other current which may flow or be induced in said loop from the track rails, and in which said receiver means comprises, (b) a band pass filter connected across said second transformer secondary winding and tuned to pass only said selected frequency of said generator, and (c) a register relay coupled to receive a signal passed by said filter and responsive thereto for registering an indication of the unbroken condition of said first and second conductors, (d) said relay further responsive to the absence of any signal from said filter for registering an indication of an interruption of said first or second conductor.

9. In a railroad track circuit for a section of railroad track, a security arrangement to assure continuity of the connections from the rails to a wayside apparatus comprising, (a) a pair of conductors connected at one end to adjacent points on each rail, and (b) a continuity detection means coupled between the other ends of each pair of conductors and one terminal of said wayside apparatus for completing parallel circuit paths between the associated rail and said wayside apparatus terminal, (c) each continuity detection means responsive to the flow of equal currents in the associated pair of conductors for holding an indication of unbroken conductors and to the unequal flow of currents in said associated pair of conductors for actuating an indication of a lack of continuity in one of said parallel paths, whereby that path can be restored prior to a complete interruption of the connection between the corresponding rail and said apparatus to cause a track circuit failure.

10. A security arrangement for a railroad track circuit as defined in claim 9 in which, (a) each continuity detection means is a two-winding relay having one winding connected in series with each of the associated pair of conductors between the corresponding rail and said wayside apparatus, (b) said winding connections being so poled that said relay is non-responsive to the flow of equal currents in each of said associated pair of conductors, (c) said relay responsive to the unequal flow of current for registering an indication of lack of continuity in one conductor of said associated pair and actuating an alarm of the fault condition.

11. A security arrangement for a railroad track circuit as defined in claim 9 in which each continuity detector means comprises, (a) a first and a second transformer,
   (1) one winding of said first transformer connected in series with one conductor of the associated pair between the corresponding rail and said apparatus terminal,
   (2) one winding of said second transformer connected in series with the other conductor of said associated pair between said corresponding rail and said apparatus terminal, (b) an alternating current generator means, having a selected output frequency distinct from any other frequency in said track circuit or section rails, connected across another winding of said first transformer for inducing a flow of current of said selected frequency in a loop formed by said associated pair of conductors, said one winding of each transformer, the corresponding rail between said adjacent points, and said one terminal of said wayside apparatus, only when both associated conductors are unbroken, and (c) receiver means connected across another winding of said second transformer and responsive only to output of said selected frequency induced by loop current into said second transformer other winding for registering an indication that both conductors of said associated pair are unbroken, (d) said receiver means responsive to the absence of any selected frequency output from said second transformer for registering an indication of a lack of continuity of one conductor of said associated pair and for actuating an alarm of said fault condition.

* * * * *